US006466441B1

(12) United States Patent
Suzuki

(10) Patent No.: US 6,466,441 B1
(45) Date of Patent: Oct. 15, 2002

(54) COOLING DEVICE OF ELECTRONIC PART HAVING HIGH AND LOW HEAT GENERATING ELEMENTS

(75) Inventor: Masahiro Suzuki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/662,317

(22) Filed: Sep. 14, 2000

(30) Foreign Application Priority Data

Oct. 21, 1999 (JP) ............................................. 11-299076

(51) Int. Cl.[7] ............................................... H05K 7/20
(52) U.S. Cl. .................. 361/695; 165/80.3; 165/104.33; 174/15.2; 174/16.3; 257/715; 257/722; 361/695; 361/700; 361/704; 361/715
(58) Field of Search ............................... 165/80.2, 80.3, 165/80.4, 104.33; 174/15.2, 16.3; 257/722, 714–716; 361/688–690, 694–695, 699–704, 707, 710, 715, 718–720

(56) References Cited

U.S. PATENT DOCUMENTS 5,930,113 A * 7/1999 McCann ..................... 361/704

6,065,530 A * 5/2000 Austin et al. ............... 165/80.3

FOREIGN PATENT DOCUMENTS

JP 6-334374 12/1994

* cited by examiner

*Primary Examiner*—Gregory Thompson
(74) *Attorney, Agent, or Firm*—Armstrong, Westerman & Hattori, LLP

(57) ABSTRACT

The cooling device of an electronic part including a substrate and first and second electronic elements. The first element (processor) is higher than the second element, and the first element generates more heat than the second element. A cooling device includes a heat conductive plate to which heat is transferred from the first element and radiation fins mounted on the heat conductive plate. The radiation fins extend toward the second element, so that at least part of heat transferred from the first element is radiated in the neighborhood of the second element. Even in the case where the electronic part is arranged in a limited space, the cooling efficiency of the electronic part can be improved by alleviating the difference in heat generation density between the neighborhood of the first element and the neighborhood of the second element.

21 Claims, 10 Drawing Sheets

COOLING DEVICE OF ELECTRONIC PART HAVING HIGH AND LOW HEAT GENERATING ELEMENTS

BACKGROUND OF THE INVENTION

1. Field of the Invention

The present invention relates to a cooling device of an electronic part arranged in a PC server or a UNIX server, for example. The present invention also relates to an electronic apparatus including such a cooling device.

2. Description of the Related Art

In a PC server and a UNIX server playing the central role in the network that has seen a rapid development in recent years, a plurality of substrate units are mounted, each including one or a plurality of integrated circuit elements or packages, typically represented by a processor generating much heat.

Performance of the processor has recently been improved and the number of semiconductor circuits mountable in one chip has increased sharply, resulting in a correspondingly increased heat generated by the processor. Once the temperature of the processor exceeds an operation guaranteed temperature (generally, 80° C. to 100° C.), however, the normal function of the processor may be adversely affected.

In order to solve this problem, Japanese Unexamined Patent Publication (Kokai) No. 6-334374, for example, discloses a cooling structure in which a heat conductive member is mounted on the back of a high heat generating chip such as a processor, and the heat conductive member is inserted in a heat sink base plate having a multiplicity of radiation fins thereby to form a heat transmission path, thereby making it possible to efficiently radiate the heat generated by the high heat generating chip.

The PC server and the UNIX server described above are often used in a stack of multiple layers in a rack or the like. In order to install a multiplicity of servers in a small space, each server is desirably as thin as possible. Nevertheless, the prior art described above poses the problem that the server cannot be made thin for the reason described below.

An object of the cooling structure described in Japanese Unexamined Patent Publication (Kokai) No. 6-334374 is to prevent the heat generated by a high heat generating chip from being transferred to the other chips. In order to achieve this object, the heat sink base plate is installed in considerably spaced relation with the chips, and the heat conductive member for coupling the high heat generating chip and the heat sink base plate is bent substantially in the shape of Z as viewed sideways. Due to this structure, a large space is formed between the heat conductive member and a chip arranged downstream of the high output heat generating chip in the cooling air (hereinafter referred to as the low output heat generating chip), with the result that the heat conduction to the low output heat generating chip is suppressed.

An attempt to reduce the thickness of the server having the conventional structure described above would make it necessary to reduce the intervals between the multilayered substrates which in turn leads to a correspondingly smaller interval between the heat sink base plate and the substrates. This smaller interval reduces the space for preventing the heat conduction in the neighborhood of the low output heat generating chip, thereby making it impossible to achieve the object of the conventional structure described above, i.e. the prevention of heat conduction to the low output heat generation chip. Also, a smaller interval between the heat sink base plate and the substrates further causes the heat conductive member arranged upstream of the low heat generating chip in the cooling air to further block a smooth flow of the cooling air, with the probable result that some areas are exposed to the cooling air more than other areas. Since the processor is expected to be improved in performance more and more in the future, with an increased heating value, it is considered difficult to form a thinner server with the conventional structure described above.

On the other hand, various components are mounted on the substrate and therefore both the heating value and the size are not uniform. In the area in the neighborhood of the processor constituting a high heat generating element, for example, the heat generation density is locally increased, while the heat generation density is comparatively small in the area where a integrated circuit element or a package constituting a low heat generating element is mounted. An attempt to reduce the temperature of the area having a large heat generation density below the operation guaranteed temperature by increasing the amount of the cooling air, for example, would excessively reduce the temperature of the area having a small heat generation density, with the result that the areas not required to be cooled are undesirably cooled. Especially in the case where the rotational speed of the cooling fan is limited for noise suppression, the uneven distribution of the heat generation density can be a stumbling block to a thickness reduction of the server.

SUMMARY OF THE INVENTION

In view of the aforementioned problem of the prior art, the object of the present invention is to provide a cooling device for an electronic part in which uneven distribution of the heat generation density is eliminated for an improved cooling efficiency of the electronic part.

In order to achieve this object, according to the present invention, there is provided a cooling device of an electronic part having a substrate, a first heat generating element mounted on the substrate, and a second heat generating element mounted on the substrate and generating less heat than the first heat generating element, the height of the first heat generating element when mounted on the substrate being greater than a height of the second heat generating element when mounted on the substrate, the cooling device comprising a heat conductive member to which heat is transmitted from the first heat generating element and radiation members mounted on said heat conductive member in heat transferring fashion, said radiation members extending toward the second heat generating element, the radiation members being also formed in a space between the combination of the first heat generating element and the heat conductive member and the second heat generating element.

An electronic apparatus according to the present invention comprises a plurality of package units including at least one substrate unit, which includes the feature.

In this cooling device, in the case where the elements are arranged in a limited space, the cooling efficiency of the first heat generating element can be improved by reducing the difference of the heat generation density between the neighborhood of the first heat generating element and the neighborhood of the second heat generating element through the heat conductive member and the radiation members.

Preferably, the heat transferring efficiency can be improved by appropriately making the heat conductive member from a plate formed of a material having an isotropic heat conduction and/or a material having both a high heat conductivity and an anisotropic heat conduction.

By the way, the material having the isotropic heat conduction is a metal such as copper and aluminum and the material having the anisotropic heat conduction is carbon graphite or the like, but the invention is not limited to these materials.

The plate can transmit the heat more efficiently through heat pipes if one or a plurality of heat pipes are built therein.

Further, if the plate has a first heat pipe and a second heat pipe built therein in such a manner that the first heat pipe extends in a first direction and the second heat pipe extends in a second direction different from the first direction along the plane of the plate with heat pipes of one of the heat pipes bent to avoid interference with heat pipes of the other heat pipe at each intersection thereof, then the heat transmission in two directions of the plate can be improved further and the two heat pipes can be built into the plate in a compact form thereby making it possible to reduce the thickness of the plate, for example.

Also, if the plate extends in parallel to said substrate and has a notch and/or a hole for avoiding the parts mounted on the board, the plate can be extended more widely regardless of the size of the parts mounted on the substrate.

Further, if the plate has a plurality of portions having different spaced relations with the substrate, the plate can be bent to avoid tall parts such as a small substrate module arranged in a position perpendicular to the board. By doing so, the plate can be extended more widely regardless of the size of the parts mounted on the substrate.

Furthermore, if the portions of the plate described above are coupled to each other by heat pipes, different plate portions can be arranged in the neighborhood of tall parts and short parts, respectively, and coupled by heat pipes. In this way, the plate can be arranged in a wider range regardless of the size of the parts mounted on the board. Even in the case where the heat pipes are arranged in a direction crossing the flow of the cooling air, the cooling air flow is only slightly blocked as long as the heat pipes have a circular section.

In the electronic apparatus, in the case where the elements are arranged within a limited space, the cooling efficiency of the first heat generating element can be improved by reducing the difference in heat generation density between the neighborhood of the first heat generating element and the neighborhood of the second heat generating element through the heat conductive member and the radiation members. Thus, the thickness of each package unit can be reduced, so that a greater number of package units can be stacked without increasing the total height of the electronic apparatus.

BRIEF DESCRIPTION OF THE DRAWINGS

The present invention will become more apparent from the following description of the preferred embodiments, with reference to the accompanying drawings, in which:

FIGS. 7A and 7B are views showing a second embodiment of the heat conductive plate, in which FIG. 7A is a planview and FIG. 7B is a side view;

FIGS. 9A and 9B are views showing a fourth embodiment of the heat conductive plate, in which FIG. 9A is a planview, and FIG. 9B is a side view;

DESCRIPTION OF THE PREFERRED EMBODIMENTS

Figure 1:
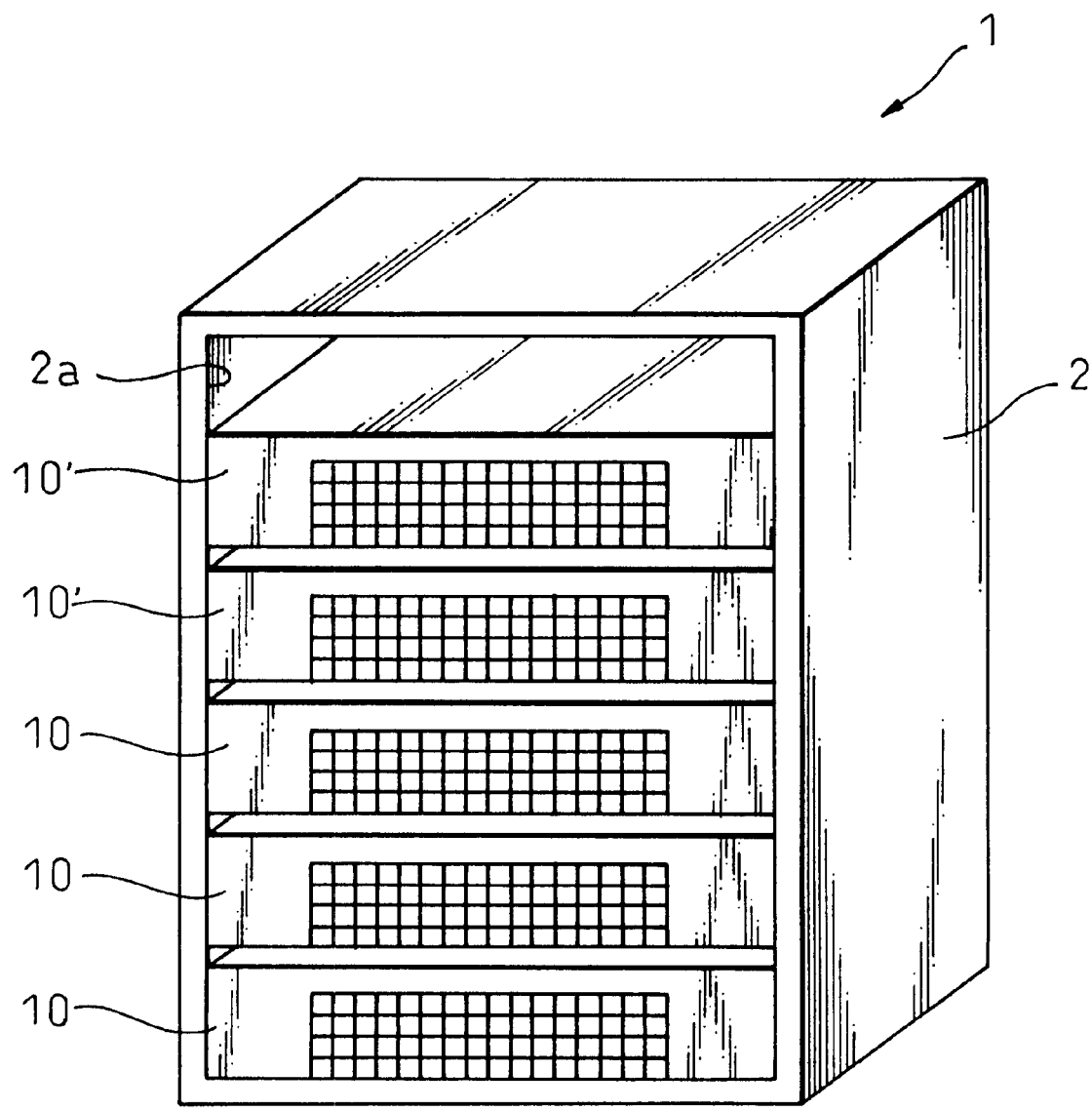
FIG. 1 is a perspective view showing a UNIX server assembly including a cooling structure of an electronic part according to a first embodiment of the present invention, with several portions omitted.

The present invention will now be explained below with reference to the embodiments and the drawings. FIG. 1 is a perspective view of a UNIX server assembly including a cooling structure of an electronic part according to a first embodiment of the invention, with several portions omitted. A UNIX server assembly 1 constituting an electronic apparatus includes five UNIX servers 10 according to this embodiment. Other units 10' can also be mounted. In other words, the UNIX server assembly 1 is a combination of a plurality of UNIX server units (package units) 10 each having a processor mounted therein to meet a given specification or provide expandability.

More specifically, the inner side wall of a box-shaped rack 2 having a front opening 2a is formed with rails (not shown) extending in the depth direction from the opening 2a, and the UNIX server units 10 can be mounted by being inserted into the rack 2 by way of the opening 2a and along the rails. The UNIX server units 10 mounted in the rack 2 are interconnected by wiring to function an integrated UNIX server assembly or several individual units. The UNIX server units 10, which are vertically stacked in the rack according to this embodiment, can be used alternatively by being juxtaposed. horizontally in the rack 2.

As described above, a plurality of UNIX server units 10 are stacked and make up the UNIX server assembly 1. As far as the height of the rack 2 is constant, more UNIX server units 10 can be accommodated in the rack 2 by reducing the thickness of the UNIX server units 2, thereby making it possible to improve the performance of the UNIX server assembly 1 and the efficiency with which the space is used.

Figure 2:
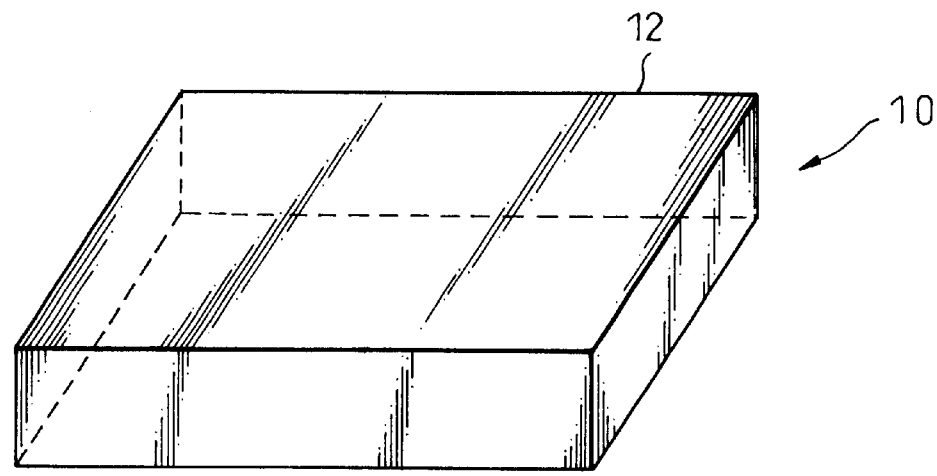
FIG. 2 is a perspective view showing one of the UNIX server units according to this embodiment, with several portions omitted.
Figure 2:
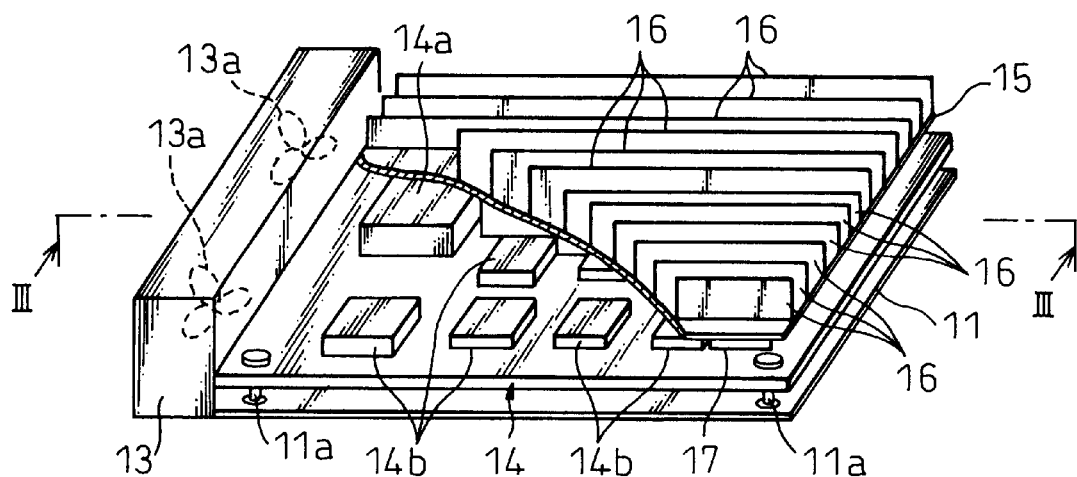

FIG. 2 is a perspective view showing one of the UNIX server units 10 according to this embodiment, with several portions omitted. FIG. 2 shows the state in which a cover 12 is removed upward. A rectangular base 11 makes up a housing with the cover 12, and a cooling unit 13 including two fans 13a are installed at the left end portion of the base 11. The motor for driving the fans 13a is not shown.

A substrate 14 is arranged above the base 11 and supported by four supports 11a (of which only two are shown). Various electronic elements are mounted on the substrate 14 to constitute one electronic circuit. More specifically, an integrated circuit element/package (hereinafter referred to as processor) 14a which generates a comparatively large amount of heat (about 50 to 60 W), and integrated circuit elements/packages 14b which generate a comparatively small amount of heat (about 2 to 3 W) are mounted on the substrate 14 either directly by soldering or through a connector. The number of processors is either 1 or plural depending on the specification of the UNIX server assembly 1. FIG. 2 shows the case in which a single processor 14a is mounted. To facilitate understanding, connectors for transferring external signals and power, various capacitors and resistors, mechanical parts such as fittings, and a DC-DC converter for supplying power are neither shown nor described here.

Figure 3:
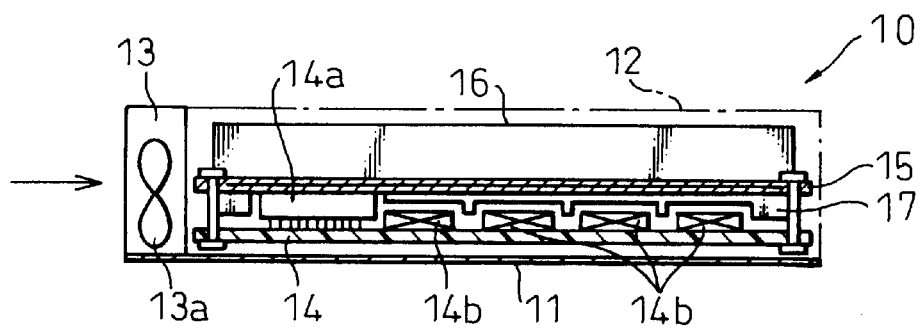
FIG. 3 is a sectional view of the structure of FIG. 2, taken along the lines III—III in FIG. 2.

FIG. 3 is a view of the electronic part of FIG. 2, taken along the lines III—III in FIG. 2. In FIGS. 2 and 3, a heat conductive plate 15 extending substantially over the same range as the substrate 14 is arranged above the integrated circuit elements/packages 14a and 14b. The heat conductive plate 15 making up a heat conductive member is arranged in contact with the upper surface of the processor 14a, which is higher than the other integrated circuit elements/packages 14b, and extends horizontally (the direction of the cooling air flow of the cooling unit 13).

The heat conductive plate 15 and the processor 14a may be contacted each other directly or, to reduce the thermal resistance, desirably through Radiation Silicone Rubber Sheet Type TC-TX (trade name) or Radiation Oil Compound G750/G751 (trade name) marketed by Shin-etsu Chemical Industry or SC102 Radiation Compound (trade name) marketed by Toray Dow Corning Silicone.

Figure 4:
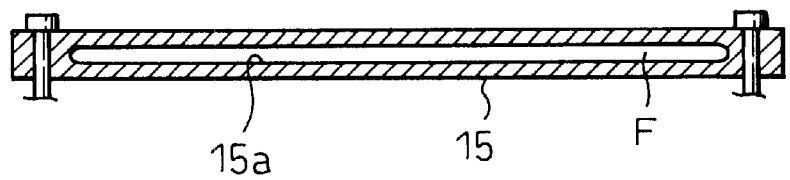
FIG. 4 is a sectional view of the heat conductive plate.

FIG. 4 is a sectional view of the heat conductive plate 15. As shown in FIG. 4, a thin hollow 15a is formed in the heat conductive plate 15 and fluorocarbon F constituting a solvent of low boiling point is sealed in the hollow 15a. The heat conductive plate 15 may be formed of a metal material having a high heat conductivity and an isotropic heat conduction such as copper or aluminum or a material having a high heat conductivity in a predetermined direction and an anisotropic heat conduction such as carbon graphite. In the case where the heat conductive plate 15 is formed of a material having the anisotropic heat conduction, the cooling efficiency of the processor 14a is desirably improved by arranging the heat conductive plate 15 in such a position that a high heat conductivity is exhibited along the horizontal direction as shown in FIG. 4.

In FIGS. 2 and 3, a multiplicity of radiation fins 16 and 17 in the form of metal foils (copper, aluminum, etc.) are mounted to extend in the direction perpendicular to the upper surface and the lower surface of the heat conductive plate 15. The radiation fins 16 and 17 making up radiation members may be mounted on the heat conductive plate 15 either directly or, to reduce the thermal resistance, desirably through a material having a superior heat conductivity such as Radiation Silicone Rubber Sheet Type TC-TX (trade name) or Radiation Oil Compound G750/G751 (trade name) marketed by Shin-etsu Chemical Industry or SC102 Radiation Compound (trade name) marketed by Toray Dow Corning Silicone. In the case where the radiation fins 16 and 17 are mounted on the heat conductive plate 15 with adhesive, on the other hand, the bonding is accomplished while maintaining a satisfactory heat conductivity desirably by use of SE4420 Radiation Adhesive (trade name) marketed by Toray Dow Corning Silicone.

The radiation fins 16 mounted on the upper surface of the heat conductive plate 15 extend over substantially the whole of an area defined by the cover 12 indicated by the one-dot chain in FIG. 3 and the heat conductive plate 15, whereby a large radiation area is secured.

The radiation fins 17 mounted on the lower surface of the heat conductive plate 15, on the other hand, are formed over substantially the whole surface, except for an area (the area 15b in FIG. 5) where the heat conductive plate 15 contacts the processor 14a either directly or indirectly. The radiation fins 17 are in such a shape as to avoid the remaining integrated circuit elements/packages 14b. The substrate 14, the elements 14a and 14b, the heat conductive plate 15 and the radiation fins 16 and 17 make up a substrate unit. The shape of the radiation fins 17 will be described more specifically.

Figure 5:
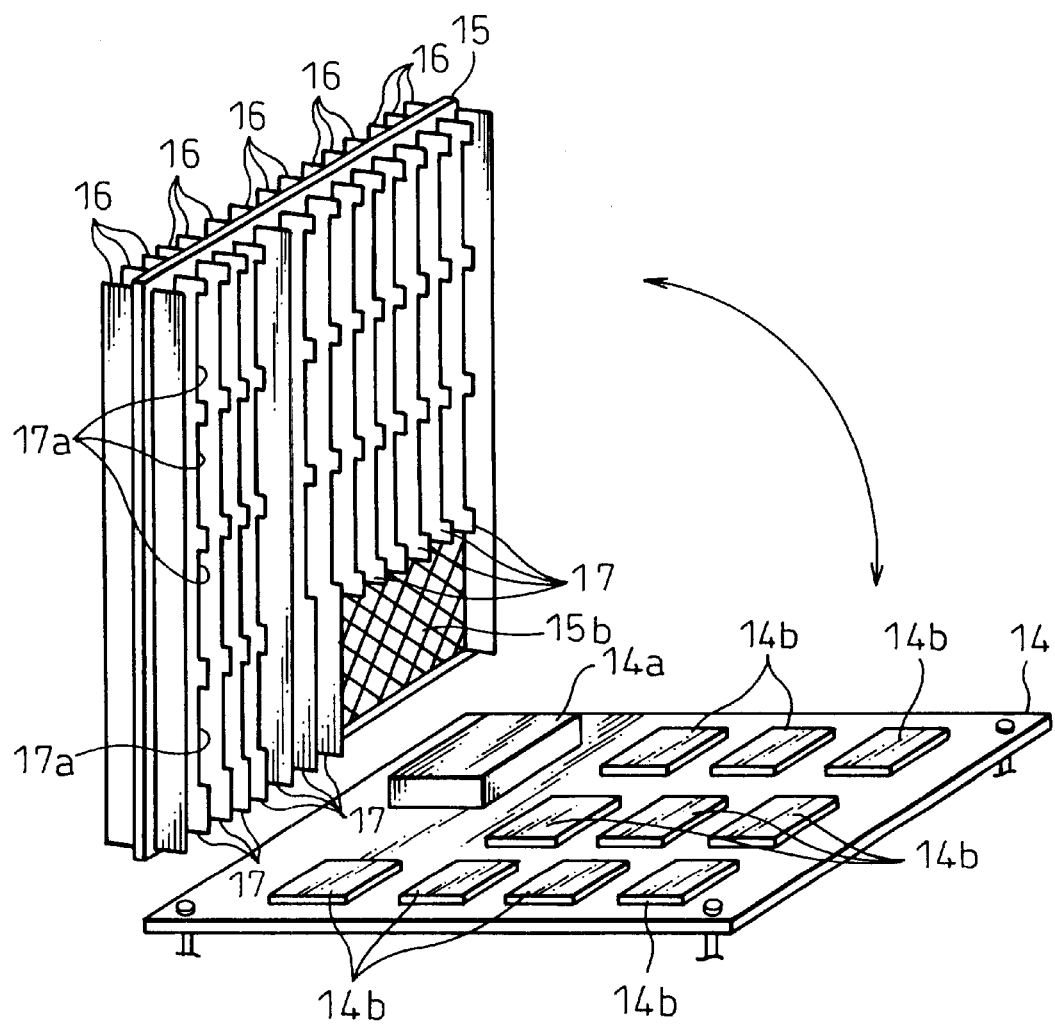
FIG. 5 is a perspective view showing the heat conductive plate and the radiation fins removed integrally from the substrate.

FIG. 5 is a perspective view showing the heat conductive plate 15 and the radiation fins 16 and 17, with these members integrally removed from the substrate 14. In FIG. 5, reference is made to the second radiation fin 17 viewed from this side (left side). The radiation fin 17 is formed with rectangular notches 17a at four points. As shown in FIGS. 2 and 3, when the heat conductive plate 15 and the radiation fins 16 and 17 are installed on the substrate 14, a predetermined gap of, say, about 2 to 3 mm is secured in order to keep the radiation fins 17 out of contact with the four integrated circuit elements/packages 14b under them. The presence of the gap keeps the integrated circuit elements/packages 14b out of contact with the radiation fins 17 on the one hand and prevents the heat transferred by the processor 14a from being transferred directly to the other integrated circuit elements/packages 14b through the heat conductive plate 15 and the radiation fins 17 on the other hand. The other radiation fins 17 basically have a similar shape. The six radiation fins 17 on the rear side shown in FIG. 5, however, are shorter than the radiation fins 17 on the front side in order to secure the area 15b for contact with the processor 14a.

Figure 6:
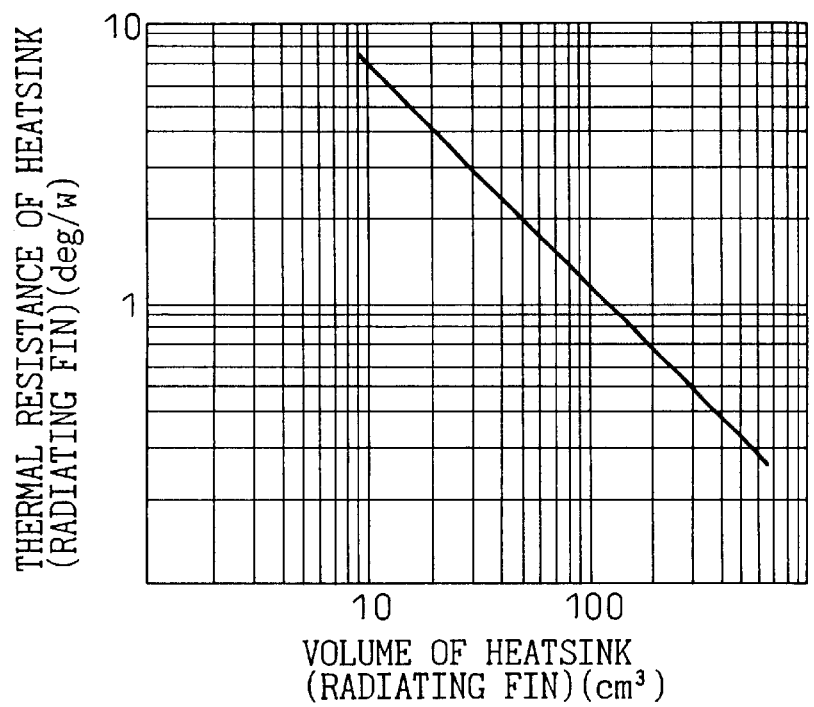
FIG. 6 is a graph showing the cooling characteristic of ordinary radiation fins.

The cooling efficiency of the UNIX server unit 10 according to this embodiment is considered next. FIG. 6 is a graph showing the cooling characteristic (thermal resistance Rout of the radiation fins) of ordinary radiation fins for the air flow velocity of 1 m/sec. As an example, assume that a processor package 14a of 30 mm square in size has an internal thermal resistance Rin of 0.2 deg/W and a generating heat value Pi of 50 W and the temperature Ta of the cooling air supplied from the cooling unit 13 is 30° C. Also assume that the junction temperature of the processor chip 14a is required to be controlled to not higher than 80° C. at which the operation and the reliability are guaranteed.

Assuming that this processor package 14a includes radiation fins of 35 mm$^3$ and that the air is supplied at the rate of 1 m/sec, ignoring all the detailed conditions. The junction temperature Tj1 of the processor chip can be determined as $$Tj1 = P \times (Rin + Rout) + Ta \qquad (1)$$

From FIG. 6, it is seen that Rout is about 2.3 deg/W, and therefore the calculation in the foregoing equation shows that Tj1 is 155° C. Thus cooling is impossible.

In contrast, according to this embodiment comprising the heat conductive plate 15 in which the heat is transferred along the horizontal direction and released by way of the radiation fins 16 and 17 arranged over the maximum range possible in the space defined between the substrate 14 and the cover 12, the apparent size of the radiation fins of the processor package 14a can be increased to, say, 50 mm×35 mm×100 mm by utilizing the dead space in the housing. In such a case, Rout assumes the value of 0.8 deg/W from FIG. 6 and so Tj1 is 80° C., thereby making it possible to secure a sufficient cooling performance.

As described above, according to this embodiment, the heat transferred from the processor 14a generates convection in the fluorocarbon F in the hollow 15a of the heat conductive plate 15. Therefore, by utilizing what is called the heat siphon effect, the heat can be efficiently transferred to all the radiation fins 16 and 17 mounted on the upper and lower surfaces of the heat conductive plate 15. Also, the extensive arrangement of the radiation fins 16 and 17 in the dead space in the housing of the UNIX server unit 10 makes possible efficient heat exchange with the cooling air from the cooling unit 13, whereby the junction temperature of the processor 14a constituting a high heat generating element is reduced and thus the reliability of the UNIX server unit 10 can be maintained.

In the prior art, priority is given to the prevention of heat transfer to the integrated circuit elements/packages of a low heat value, and therefore the problem is that the temperature distribution in the housing of the UNIX server unit 10 is not uniform. According to this embodiment, in contrast, the heat is radiated also in the neighborhood of the integrate circuit elements/packages 14b having a low heat value to assure a substantially uniform temperature distribution in the housing, and therefore a processor 14a of a high heat value can be cooled efficiently even in a smaller housing. This embodiment thus is suitable for use with a PC server assembly and a UNIX server assembly of such a type that the UNIX servers 10 are stacked in the rack 2 as shown in FIG. 1. Also, this embodiment can meet the requirement of the UNIX server assembly or the PC server assembly having mounted thereon a processor which is considered to assume a high heating value in the future.

Also, according to this embodiment, the heat conductive plate 15 extends from the processor 14a in horizontal direction over the whole housing. Therefore, the blocking of the cooling air flowing in the horizontal direction from the cooling unit 13 by the heat conductive plate 15 is minimized, so that the cooling efficiency of the processor 14a can be further improved. Also, a thermal coupling as thin as not more than 1 mm can be realized on the processor 14a on the substrate 14 extending in parallel to the substrate 14 through a high heat conductive filler such as a thermal compound or a high heat conductive adhesive, with the result that a high cooling performance is expected. The advantage of the embodiment is that a comparatively short thermal coupling, even though not more than 1 mm thick, can also be formed in view of the opposed relation with the substrate 14c.

Figure 7A:
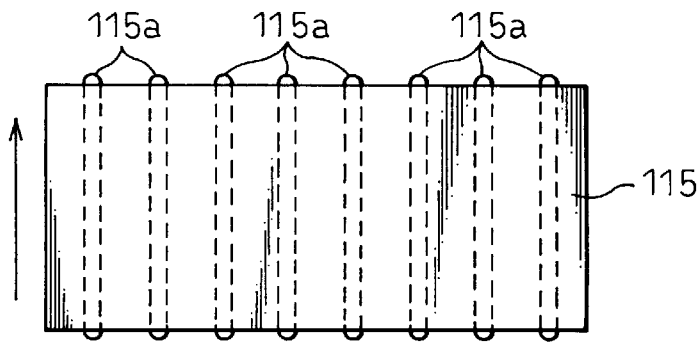
Figure 7B:
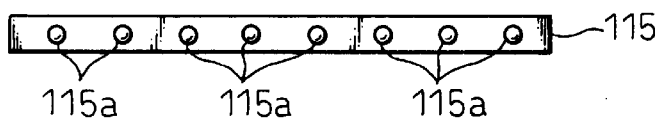

FIGS. 7A and 7B show a heat conductive plate according to a second embodiment, in which FIG. 7A is a top plan view and FIG. 7B is a front view of the heat conductive plate. In FIG. 7A, the radiation fins are not shown and the cooling air is assumed to flow in the direction of arrow. The heat conductive plate 115 shown in FIG. 7 is formed of a material similar to that of the heat conductive plate shown in FIG. 4, but not formed with an internal hollow. A plurality of heat pipes 115a are embedded in the heat conductive plate 115.

More specifically, eight heat pipes 115a with sealed ends are embedded in the heat conductive plate 115 and extend in the direction of the cooling air flow. The hollow heat pipes 115a have sealed therein a metal fiber, water or alcohol, for example. However, the structure of the heat pipe is well known and therefore will not be described in detail.

According to this embodiment, the convection, evaporation or condensation of water or alcohol is caused in the heat pipes 115a embedded in the heat conductive plate 115, and therefore the heat can be efficiently transferred to the whole of the radiation fins (not shown) mounted on the upper and lower surfaces of the heat conductive plate 115 utilizing what is called the heat pipe effect.

Figure 8:
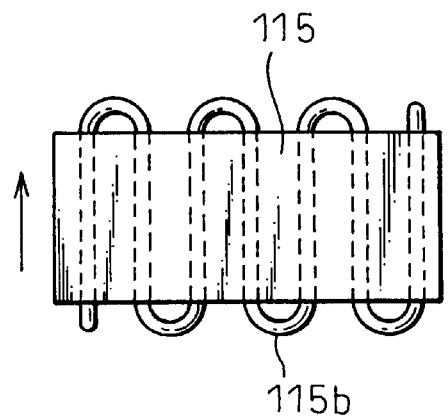
FIG. 8 is a diagram showing a third embodiment of the heat conductive plate.

FIG. 8 shows a heat conductive plate according to a third embodiment and is a view similar to FIG. 7A. The embodiment shown in FIG. 8 is different from the second embodiment shown in FIG. 7 in that a single heat pipe 115b is embedded in the heat conductive plate 115. More specifically, the heat pipe 115b extends in the direction of the cooling air flow as indicated by arrow and is folded back in a reverse direction at each point leaving the heat conductive plate 115 and arranged in zigzag form as viewed from above.

According to this embodiment, the single heat pipe 115b is arranged two-dimensionally on the heat conductive plate 115 and therefore the heat transferred from the processor (not shown) can be two-dimensionally transferred through the heat pipe 115b. Thus, the heat can be efficiently transferred to all the radiation fins (not shown) mounted on the upper and lower surfaces of the heat conductive plate 115.

Figure 9A:
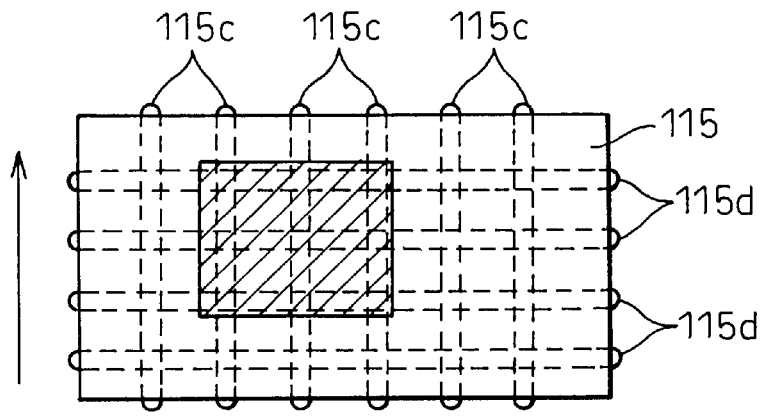
Figure 9B:
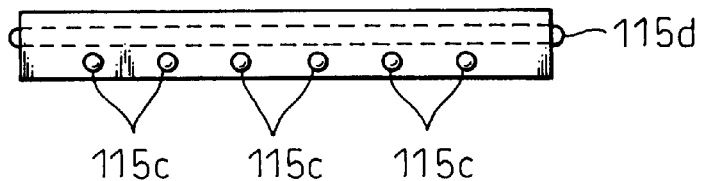

FIG. 9A shows a heat conductive plate according to a fourth embodiment, and is a top plan view similar to FIG. 7A. FIG. 9B is a side view similar to FIG. 7B. In FIGS. 9A and 9B, the present embodiment is different from the second embodiment shown in FIGS. 7A and 7B in that a plurality of heat pipes 115c and 115d embedded in the heat conductive plate 115 are arranged at right angles to each other. More specifically, the six heat pipes 115c are arranged in parallel to each other in the direction of the cooling air flow indicated by arrow, and the four heat pipes 115d, as clear from FIG. 9B, are arranged above and at right angles to the heat pipes 115c. The spaced relation between the heat pipes 115c and 115d is desirably adjusted to such an extent that the processor 14a extends over a plurality of the heat pipes 115c and 115d. By the way, the configuration of the heat pipes 115c and 115d themselves is similar to that of the second embodiment.

According to this embodiment, the heat pipes 115c and 115d are arranged two-dimensionally on the heat conductive plate 115, and the heat transferred from the processor (not shown) can be rapidly transferred, two-dimensionally, through the heat pipes 115c and 115d which are shorter than the heat pipes 115b of the third embodiment. Therefore, the heat can be efficiently transferred to all the radiation fins (not shown) mounted on the upper and lower surfaces of the heat conductive plate 115.

Figure 10:
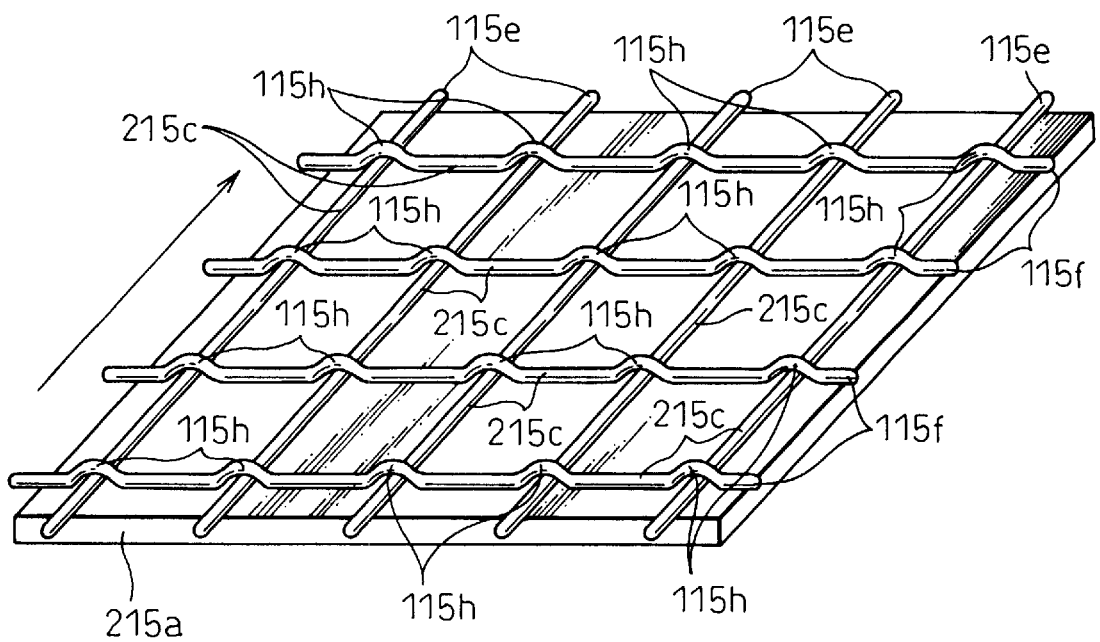
FIG. 10 is a perspective view showing a fifth embodiment of the heat conductive plate.

FIG. 10 is a perspective view showing a heat conductive plate according to a fifth embodiment. This embodiment is different from the fourth embodiment shown in FIGS. 9A and 9B in that a plurality of heat pipes 115e and 115f embedded in two portions of a heat conductive plate 215 are arranged at right angles to each other in substantially the same plane. More specifically, longitudinal and transverse. grooves 215c are formed in the upper surface of the lower half portion 215a of the heat conductive plate 215, and the heat pipes 115e and 115f are arranged in the grooves. The upper half portion of the heat conductive plate 215 is not shown.

The five heat pipes 115e arranged in parallel to the flow of the cooling air indicated by an arrow are linear while the four heat pipes 115f arranged to cross the heat pipes 115e above are formed with bends 115h above the crossing points, respectively, thereby to prevent the interference with the heat pipes 115e.

Figure 11:
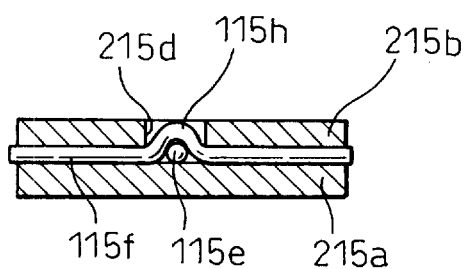
FIG. 11 is a sectional view of the heat conductive plate shown in FIG. 10.

FIG. 11 is a partial sectional view of the heat conductive plate shown in FIG. 10. An upper half portion 215b combined with a lower half portion 215a to make up the heat conductive plate 215 is formed with a cut-out hole 215d as a relief to avoid the interference with the bend 115h of the heat pipe 115f. By the way, the cut-out hole 215d may alternatively be a recess.

According to this embodiment, the heat pipes 115e and 115f are arranged two-dimensionally on the heat conductive plate 115, so that the heat transferred from the processor (not shown) can be rapidly transferred two-dimensionally. Thus, the heat can be efficiently transferred over the whole of the radiation fins (not shown) mounted on the upper and lower surfaces of the heat conductive plate 115. Further, unlike in the fourth embodiment, the heat pipes 115e and 115f are arranged substantially in the same plane and therefore the thickness of the heat conductive pipe 215 can be reduced to provide a thinner UNIX server unit.

Small board modules called daughter boards packaged with RAM or the like may be mounted on the substrate as need arises. In many such cases, the small board modules are mounted in a position perpendicular to the substrate, and this poses the problem of interference with the heat conductive plate. According to the embodiment described below, the interference with the small board modules can be avoided.

Figure 12:
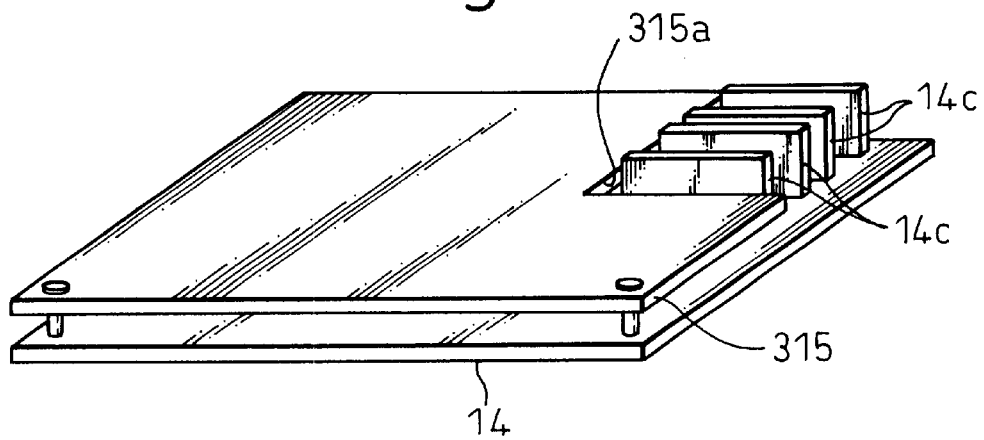
FIG. 12 is a perspective view showing a sixth embodiment of the heat conductive plate.

FIG. 12 is a perspective view showing a heat conductive plate according to a sixth embodiment. This embodiment is different from the embodiments shown in FIGS. 4 to 7B in that the heat conductive plate 315 is partially notched. More specifically, in FIG. 12, four small board modules 14c are arranged at a corner of the substrate 14 in a position perpendicular to the substrate 14. The area of the heat conductive plate 315 having the small board modules 14c is formed with a rectangular notch 315a. The other portions of the heat conductive plate 315 are configured in a similar manner to the heat conductive plates described above. In FIG. 12, the radiation fins not shown are mounted on the upper and lower surfaces of the heat conductive plate 315.

According to this embodiment, the heat conductive plate 315 is formed with the rectangular notch 315a in the area thereof having the small board modules 14c, and therefore the interference between the heat conductive plate 315 and the small board modules 14c is prevented. Even with the UNIX server unit having the small board modules 14c, therefore, the interior of the UNIX server unit can be efficiently cooled. A cut-out hole instead of a notch may be formed in the heat conductive plate for avoiding interference with tall electronic parts such as the small board modules.

As a result of cutting off a part of the heat conductive plate as a notch for avoiding the interference with tall electronic parts as in the aforementioned embodiment, the radiation fins are absent in the notched portion, and the correspondingly reduced radiation area may reduce the cooling efficiency. The embodiment described below can obviate or alleviate this problem.

Figure 13:
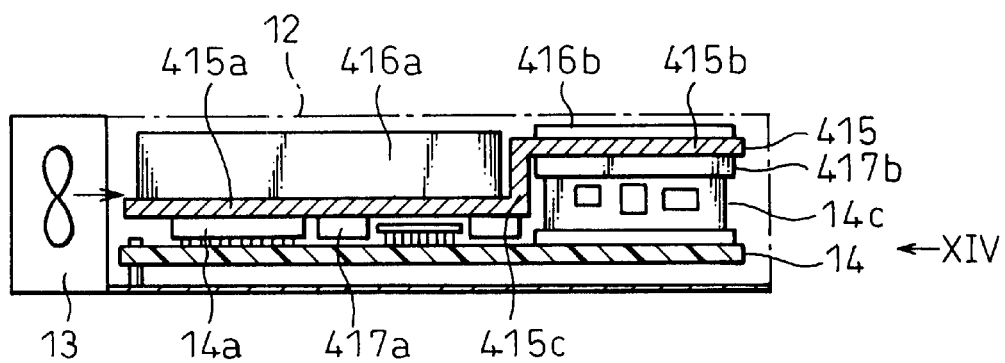
FIG. 13 is a sectional view showing a UNIX server unit including a seventh embodiment of the heat conductive plate.

FIG. 13 is a sectional view showing a UNIX server unit including a heat conductive plate according to a seventh embodiment. This embodiment is different from the embodiments shown in FIGS. 4 to 7B in that the heat conductive plate 415 is configured of two stages. More specifically, the heat conductive plate 415 includes a horizontally-extending first plate portion 415a in direct or indirect contact with the upper surface of the processor 14a constituting a high heat generating element, a second plate portion 415b extending horizontally above the small board module 14c taller than the processor 14a and a vertical plate portion 415c coupling the ends of the first plate portion 415a and the second plate portion 415b to each other.

Figure 14:
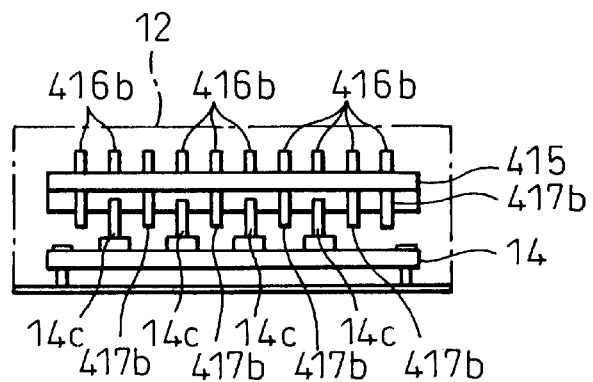
FIG. 14 is a view of the UNIX server unit of FIG. 13 taken along the direction of arrow XIV.

FIG. 14 is a view showing the UNIX server unit of FIG. 13 as viewed from the direction of arrow XIV. As shown in FIGS. 13 and 14, radiation fins 416a are mounted on the upper surface of the first plate portion 415a and radiation fins 417a are mounted on the lower surface of the first plate portion 415a in a similar manner to the embodiments described above. On the other hand, radiation fins 416b are mounted on the upper surface of the second plate portion 415b, and radiation fins 417b are mounted on the lower surface thereof.

The second plate portion 415b is shifted upward with respect to the first plate portion 415a in order to avoid the tall small board module 14c. As a result, the distance to the lower surface of the cover 12 indicated by a one-dot chain line is reduced. The radiation fins 416b mounted on the upper surface of the second plate portion 415b, therefore, are shorter than the radiation fins 416a mounted on the first plate portion 415a.

In the case where there is a gap between the lower surface of the second plate portion 415b and the small board modules 14c, the radiation fins can be mounted in such a gap, but such a gap may not always exist. On the other hand, the small board modules 14c, though tall, are often comparatively thin. As shown in FIG. 14, therefore, a wide radiation area can be secured by arranging the radiation fins 417b by and between the small board modules 14c.

By configuring the heat conductive plate 415 in two stages as described above, a problem is posed that the vertical plate portion 415c is located perpendicular to the cooling air flow from the cooling unit 13 and blocks the air flow thereof. In the embodiment described below, such a problem can also be obviated or alleviated.

Figure 15:
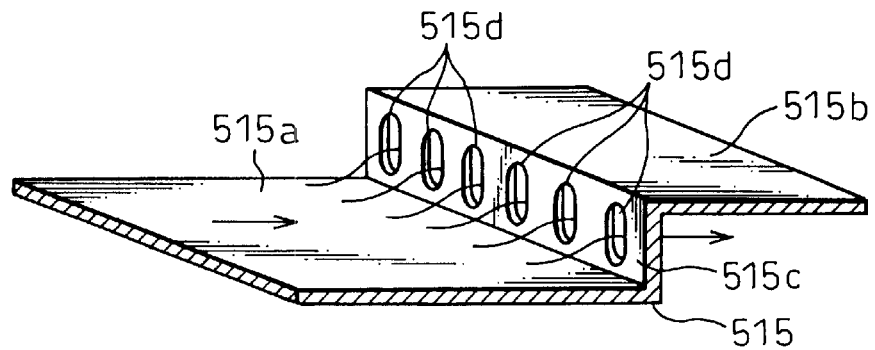
FIG. 15 is a perspective view showing an eighth embodiment of the heat conductive plate.

FIG. 15 is a perspective view showing a heat conductive plate according to an eighth embodiment. The embodiment shown in FIG. 15, like the embodiments shown in FIGS. 13 and 14, has a double-stage structure including a first plate portion 515a and a second plate portion 515b. This embodiment is different, however, in that six openings 515d are formed in the vertical plate portion 515c of the heat conductive plate 515.

In view of the fact that the openings 515d are formed in the vertical plate portion 515c, the cooling air from the cooling unit (not shown) flowing in the direction of arrow in FIG. 15 is passed through the openings 515d and flows downward on the second plate 515b for a further improved efficiency of cooling the processor.

With the configuration of the FIGS. 13 and 14, the heat conductive plate 415 is bent at the vertical plate portion 415c. Since an internal continuous hollow can be formed as shown in FIG. 4, however, the heat transfer ability to the second plate portion 415b can be secured. In the case where the openings 515d are formed in the second plate portion 515c as shown in the configuration of FIG. 15, however, it becomes difficult to form a hollow in the heat conductive plate 515. According to the embodiment described below, in contrast, the aforementioned problem can be obviated or alleviated.

Figure 16:
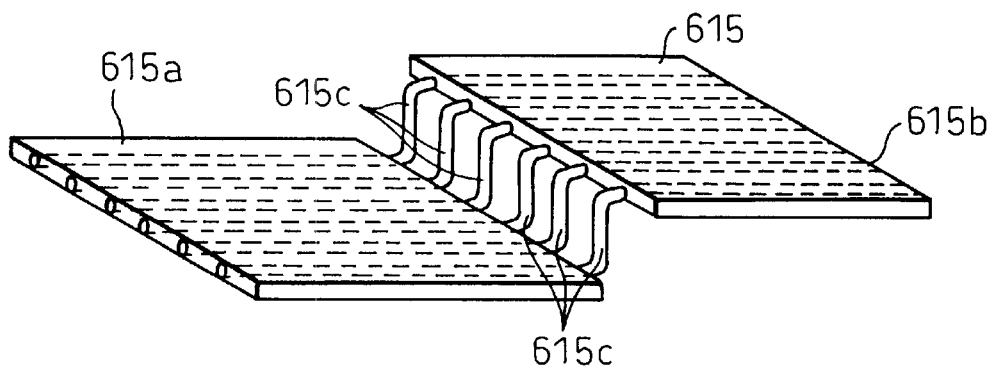
FIG. 16 is a perspective view showing a ninth embodiment of the heat conductive plate.

FIG. 16 is a perspective view showing a heat conductive plate according to a ninth embodiment. The embodiment shown in FIG. 16, like the embodiment shown in FIG. 15, has a double-stage structure, including a first plate portion 615a and a second plate portion 615b, but is not provided with the vertical plate portion. Thus, the first plate portion 615a and the second plate portion 615b are separated from each other.

The six heat pipes 615c embedded in the first plate portion 615a, after being bent in the form of crank, extend to the second plate portion 615b where they are embedded. Specifically, the heat pipes 615c are exposed to the atmosphere between the first plate portion 615a and the second plate portion 615b. The internal structure of the heat pipe 615c is similar to that in the embodiment shown in FIGS. 7A and 7B and therefore will not be explained further.

As described above, according to this embodiment, the heat transferred to the first plate portion 615a from the processor not shown can be efficiently transferred to the second plate portion 615b through the heat pipes 615c for an improved cooling efficiency. Also, the heat pipes 615c are exposed to the atmosphere between the first plate portion 615a and the second plate portion 615b, and therefore this embodiment has the advantage that the exposed portions are easily cooled by the cooling air.

Figure 17:
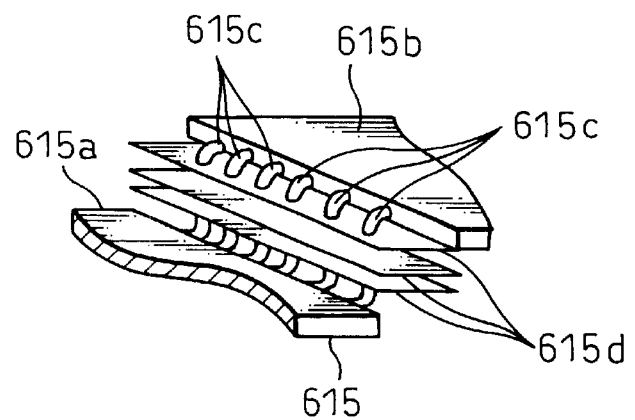
FIG. 17 is a partial perspective view showing a modification of the heat conductive plate with a further improved cooling efficiency.

FIG. 17 is a partial perspective view showing a heat conductive plate improved in cooling efficiency according to a modification. In the embodiment shown in FIG. 17 which has six heat pipes 615c like the embodiment shown in FIG. 16, three radiation fins 615d are mounted in contact with the exposed portion between the first plate portion 615a and the second plate portion 61b. The radiation fins 615d extend in horizontal direction and therefore the flow of the cooling air along the direction of arrow is not blocked.

As described above, according to this modification, the heat pipes 615c are exposed to the atmosphere between the first plate portion 615a and the second plate portion 615b, and the radiation fins 615d are mounted on the exposed portion of the heat pipes 615c. Thus, heat exchange is efficiently performed with the cooling air through the radiation fins 615d, thereby further improving the cooling efficiency of the processor not shown.

The electronic elements may be arranged differently on the substrate according to the specification of the UNIX server unit. In such a case, if the position of the radiation fins mounted on the heat conductive plate remains the same, the interference with the electronic elements may occur. Fabrication of the heat conductive plates of different shapes for different specifications of the UNIX server unit, however, would increase the cost. The embodiment described below obviates or alleviates this problem.

Figure 18:
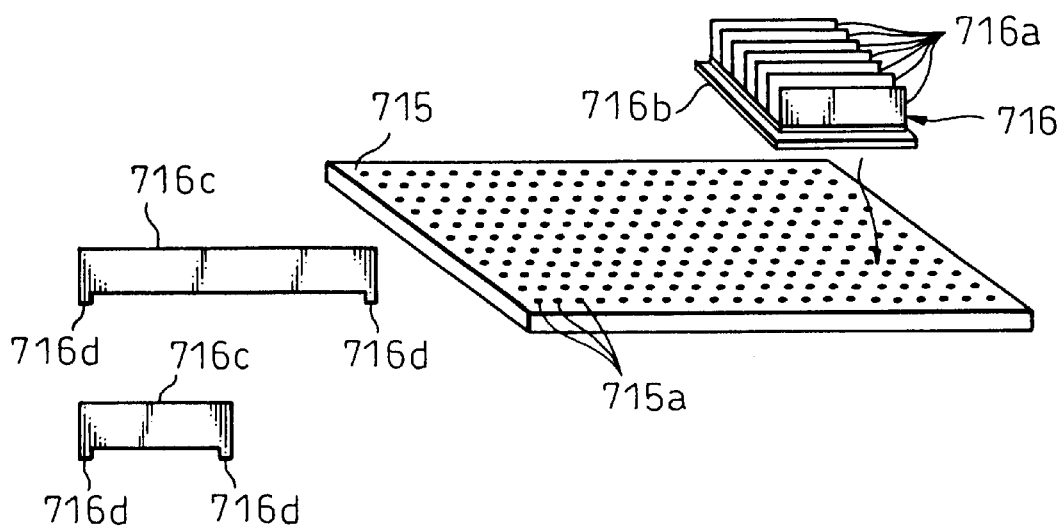
FIG. 18 is a perspective view showing a tenth embodiment of the heat conductive plate.

FIG. 18 is a perspective view showing a heat conductive plate according to a tenth embodiment. In FIG. 18, a heat conductive plate 715 before mounting radiation fins 716 thereon is shown. Threaded holes 715a arranged in a regular grid are formed on the upper and lower surfaces of the heat conductive plate 715. In FIG. 18, the heat conductive plate 715 is arranged upside down, i.e. the surface thereof opposed to the board (not shown) up, as compared with the embodiments described above.

The fin unit 716 has six radiation fins 716a mounted on a single base 716b. This fin unit 716 is adapted to be mounted at an arbitrary position on the heat conductive plate 715 where the electronic parts (including the processor) of the board not shown can be avoided, by inserting screws not shown in arbitrary threaded holes 715a. The fin units can be mounted in this way on the two surfaces of the heat conductive plate 715.

According to this embodiment, assume that the relative positions of the electronic elements are changed in accordance with the specification of the UNIX server unit, etc. By changing the mounting position of the fin unit 716 appropriately, elements can be shared and the cost can be reduced. With the UNIX server unit mass-produced with the electronic elements arranged at predetermined positions, therefore, the number of parts and the cost can be reduced. Also the labor is eliminated for assembling the radiation fins in the heat conductive plate. The heat conductive plate is of one type, and by combining several types of fins, a cooling structure is realized which has the versatility of meeting the requirements of the heating value of the elements and the shape of the parts mounted.

As a modification of this embodiment, as shown in FIG. 18, protrusions 716d are formed at the lower parts of the end portions of the radiation fins 716c of different lengths, and according to the relative positions of the electronic parts, the radiation fin 716 of an appropriate length is selected. By inserting the protrusions 716d into the threaded holes 715a appropriately, the radiation fin 716 can be mounted on the heat conductive plate 715. In the case where a multiplicity of types of UNIX servers are available, a radiation fin of an arbitrary length can be arranged in accordance with the shape of the parts mounted. The fins can also be replaced easily for an improved versatility.

Figure 19:
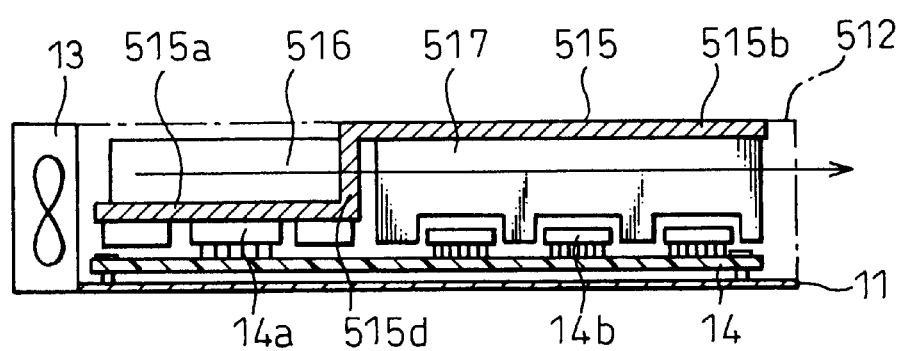
FIG. 19 is a view showing a modification of the UNIX server unit using the heat conductive plate shown in FIG. 15.

FIG. 19 shows a UNIX server unit using the heat conductive plate of FIG. 15 according to a modification. In FIG. 19, the second plate portion 515b of the.heat conductive plate 515 makes up a part of the housing. More specifically, the upper part of the cover 512 is cut out, and the second plate portion 515b is accommodated snugly in the cut-out portion to make a surface flush with the upper surface of the cover 512. The cooling air from the cooling unit 13 is passed through the opening 515d of the heat conductive plate 515 as indicated by arrow and flows from left to right. The remaining configuration is similar to that of FIGS. 12 to 14 and therefore will not be described in detail.

According to the modification shown in FIG. 19, as compared with the embodiments shown in FIGS. 13 to 15, the area of the radiation fins 517 mounted on the second plate portion 515b is maintained while at the same time improving the cooling efficiency of the processor 14a by exposing the upper surface of the second plate portion 515b out of the housing. Also, since the second plate portion 515b makes up a part of the housing, the UNIX server unit can be further reduced in thickness.

Figure 20:
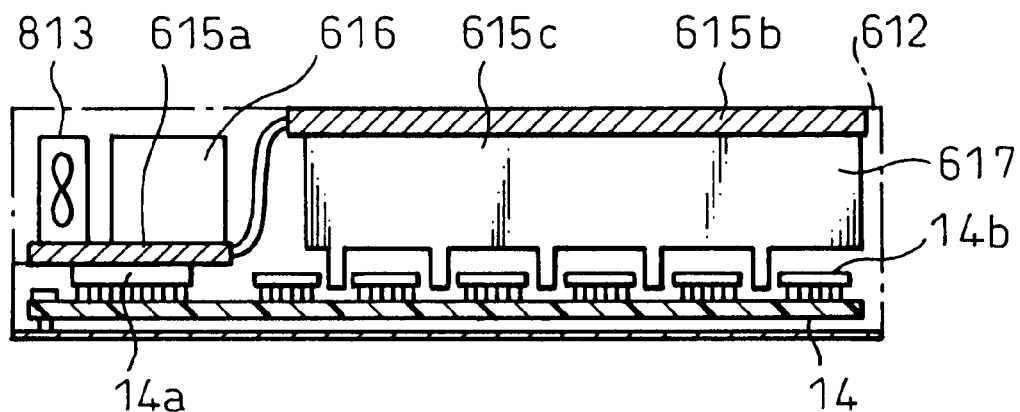
FIG. 20 is a view showing a modification of the UNIX server unit using the heat conductive plate shown in FIG. 16.

FIG. 20 shows a modification of the UNIX server unit using the heat conductive plate of FIG. 16. Also in FIG. 19, the second plate portion 615b of the heat conductive plate 615 makes up a part of the housing. More specifically, the upper portion of the cover 612 is cut out, and this cut-out portion accommodates the second plate portion 615b snugly thereby to form a surface flush with the upper surface of the cover 612. According to this modification, a small-sized cooling unit 813 is arranged on the first plate portion 615a, and the cooling air from the cooling unit 813 flows leftward through the space between the heat pipes 615c exposed between the first plate portion 615a and the second plate portion 615b. The remaining configuration is similar to that of FIGS. 13 to 15 and will not be described in detail.

According to the modification shown in FIG. 20, as compared with the embodiments of FIGS. 13 to 15, the area of the radiation fins 517 mounted on the second plate portion 615b is maintained while at the same time exposing the upper surface of the second plate portion 615b outside of the housing, thereby making it possible to improve the cooling efficiency of the processor 14a further. The improved cooling efficiency can reduce the size of the cooling unit 813 as in this modification for a lower cost. Also, it is expected that the space can be saved by mounting the cooling unit 813 on the heat conductive plate 615 in the housing.

Figure 21:
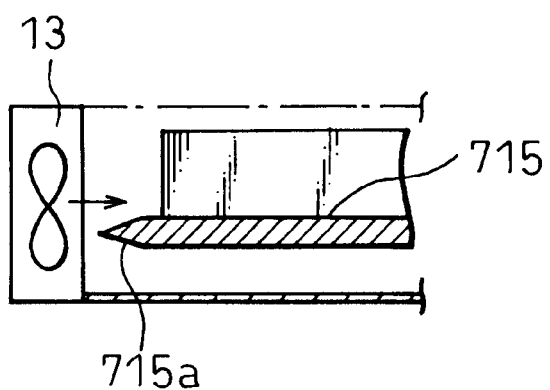
FIG. 21 is a partial sectional view showing a UNIX server unit including an 11th embodiment of the heat conductive plate.

FIG. 21 is a partial sectional view showing a UNIX server unit including a heat conductive plate according to an 11th embodiment. An end portion 715a of the heat conductive plate 715 near to the cooling unit 13 is wedge-shaped and can smooth the flow of the cooling air along the direction of arrow. The end portion 715a may be in the shape of streamline instead of wedge.

The present invention has been described above with reference to embodiments thereof and is not limited to these embodiments but is modifiable in various ways within the scope of the technical concept of the invention. The radiation fins mounted on the heat conductive plate, for example, can be porous to secure a wider radiation area or a multiplicity of pins can provided in place of the radiation fins.

As described in greater detail, in the cooling device of an electronic part according to the present invention, in the case where the elements are arranged in a limited space, the cooling efficiency of the first heat generating element can be improved by reducing the difference in the heat generation density between the neighborhood of the first heat generating element and the neighborhood of the second heat generating element through said heat conductive member and said radiation members.

In the electronic apparatus according to the present invention, in the case where the elements are arranged within a limited space, the cooling efficiency of the first heat generating element can be further improved by reducing the difference in heat generation density between the neighborhood of the first heat generating element and the neighborhood of the second heat generating element through the heat conductive member and the radiation members. Thus, the thickness of each package unit can be further reduced, so that a multiplicity of package units can be stacked without increasing the total height of the electronic apparatus.

What is claimed is:

1. A cooling device of an electronic part having a substrate, a first heat generating element mounted on said substrate, and a second heat generating element mounted on said substrate and generating less heat than said first heat generating element, a height of said first heat generating element when mounted on said substrate being greater than a height of said second heat generating element when mounted on said substrate, said cooling device comprising:

a heat conductive member covering said first and second heat generating elements, said heat conductive member being thermally coupled to said first heat generating element, said conductive member being spaced apart from said second heat generating element, said heat conductive member having a first surface on the side of said first heat generating element and a second surface on the opposite side of said first heat generating element; and radiation members including a first group of radiation members mounted on said first surface of said heat conductive member and a second group of radiation members mounted on said second surface of said heat conductive member, said first group of radiation members extending in the direction from said first heat generating element toward said second heat generating element, said first group of radiation members being formed in a space between said heat conductive member and said second heat generating element.

2. A cooling device according to claim 1, wherein said radiation members comprise fins mounted on said heat conductive member.

3. A cooling device according to claim 1, wherein a predetermined space is defined between said heat radiation members and said second heat generating element.

4. A cooling device according to claim 1, wherein said heat conductive member comprises a plate formed of at least one of a material having a high heat conductivity and an isotropic heat conduction, and a material having a high heat conductivity and an anisotropic heat conduction.

5. A cooling device according to claim 4, wherein one or a plurality of heat pipes are built in said plate.

6. A cooling device according to claim 5, wherein first heat pipes and second heat pipes are built in said plate, said first heat pipes extending in a first direction along the plane of said plate, said second heat pipes being arranged to extend in a second direction different from said first direction, said pipes being so shaped that heat pipes of one heat pipe group are bent to avoid interference with heat pipes of the other heat pipe group at the intersections of said two heat pipe groups.

7. A cooling device according to claim 6, wherein said plate has a pair of plate portions sandwiching said first heat pipes and said second heat pipes, and at least one of said plate portions is formed with recesses or holes conforming with the shape of the bent heat pipes of said first heat pipes at the intersections of said heat pipes.

8. A cooling device according to claim 4, wherein said plate extends in parallel to said substrate and includes notches and/or holes for avoiding parts mounted on said substrate.

9. A cooling device according to claim 4, wherein said plate includes a plurality of parts in different spaced relations with said substrate.

10. A cooling device according to claim 4, wherein each portion of said plate is coupled by heat pipes.

11. A cooling device according to claim 4, wherein radiation fins are mounted also on said heat pipes.

12. A cooling device according to claim 1, wherein said heat conductive member and said heat radiation members are coupled to each other through a high heat conductive material.

13. A cooling device according to claim 1, wherein said first heat generating element and said heat conductive member are coupled to each other through a high heat conductive material.

14. A cooling device according to claim 1, wherein a supply unit for supplying a cooling air flow to said heat radiation members is mounted on said heat conductive member.

15. A cooling device according to claim 14, wherein said heat conductive member is formed with one or a plurality of through holes at a surface thereof resistant to said cooling air flow.

16. A cooling device according to claim 15, wherein an end portion of said heat conductive member which is resistant to said cooling air flow is tapered.

17. A cooling device according to claim 1, wherein a mounting means is provided for mounting said heat radiation member at an arbitrary position on said heat conductive member.

18. A cooling device according to claim 14, wherein
said supply unit supplies cooling air flow to said heat radiation members in a direction from the first heat generating element toward the second heat generating element.

19. A cooling device according to claim 1, further including
a cover for covering said substrate, said first and second heat generating elements, said heat conductive member and said radiation members.

20. A cooling device of an electronic part having a substrate, a first heat generating element mounted on said substrate, and a second heat generating element mounted on said substrate and generating less heat than said first heat generating element, a height of said first heat generating element when mounted on said substrate being greater than a height of said second heat generating element when mounted on said substrate, said cooling device comprising:
   a heat conductive member, disposed in spaced relationship to said substrate, to which heat is transferred from said first heat generating element; and
   radiation members mounted on said heat conductive member in a heat transferring fashion, said radiation members extending from said heat conductive member toward said second heat generating element, said radiation members also extending from said heat conductive member toward a space between said first heat generating element and said second heat generating element, wherein said heat conductive member comprises a plate formed of at least one of a material having a high heat conductivity and an isotropic heat conduction, and a material having a high heat conductivity and an anisotropic heat conduction, and said plate has one or a plurality of hollows therein and a refrigerant of a low boiling point is sealed in said hollow(s).

21. An electronic apparatus comprising:
   a plurality of package units including at least one substrate unit; and
   said at least one substrate unit comprising:
      a substrate;
      a first heat generating element mounted on said substrate;
      a second heat generating element mounted on said substrate and generating less heat than said first heat generating element, a height of said first heat generating element when mounted on said substrate being greater than a height of said second heat generating element when mounted on said substrate;
      a heat conductive member covering said first and second heat generating elements, said heat conductive member being thermally coupled to said first heat generating element, said heat conductive member being spaced apart from said second heat generating element, said heat conductive member having a first surface on the side of said first heat generating element and a second surface on the opposite side of said first heat generating element; and
      radiation members including a first group of radiation members mounted on said first surface of said heat conductive member and a second group of radiation members mounted on said second surface of said heat conductive member, said first group of radiation members extending in the direction from said first heat generating element toward said second heat generating element, said first group of radiation members being formed in a space between said heat conductive member and said second heat generating element.

* * * * *